US012750999B2

(12) United States Patent
Park et al.

(10) Patent No.: US 12,750,999 B2
(45) Date of Patent: Sep. 29, 2026

(54) SEMICONDUCTOR DEVICE

(71) Applicant: Samsung Electronics Co., Ltd., Suwon-si (KR)

(72) Inventors: Jin-Seong Park, Seoul (KR); Jihyun Kho, Suwon-si (KR); Seunghee Lee, Suwon-si (KR); Yurim Kim, Suwon-si (KR); Yong-Suk Tak, Suwon-si (KR); Dong-Gyu Kim, Seoul (KR)

(73) Assignees: IUCF-HYU (INDUSTRY-UNIVERSITY COOPERATION FOUNDATION HANYANG UNIVERSITY), Seoul (KR); Samsung Electronics Co., Ltd., Gyeonggi-do (KR)

( * ) Notice: Subject to any disclaimer, the term of this patent is extended or adjusted under 35 U.S.C. 154(b) by 364 days.

(21) Appl. No.: 18/619,490

(22) Filed: Mar. 28, 2024

(65) Prior Publication Data

US 2025/0107065 A1 Mar. 27, 2025

(30) Foreign Application Priority Data

Sep. 22, 2023 (KR) ........................ 10-2023-0127059

(51) Int. Cl.
*H10B 12/00* (2023.01)

(52) U.S. Cl.
CPC .................................. *H10B 12/315* (2023.02)

(58) Field of Classification Search
CPC ...... H10B 12/315; H10B 12/00; H10B 12/05; H10B 12/30; H10B 12/482; H10B 12/488; H10D 64/685; H10D 64/68; H10D 64/519; H10D 64/2586; H10D 30/6755; H10D 30/67; H10D 30/6757; H10D 30/6708; H10D 30/6715; H10D 62/60; H10D 62/151; H10D 62/121; H10D 62/834
See application file for complete search history.

(56) References Cited

U.S. PATENT DOCUMENTS

| | | | |
|---|---|---|---|
| 9,466,706 | B2 | 10/2016 | Murakami et al. |
| 2011/0095288 | A1 | 4/2011 | Morosawa et al. |
| 2015/0069378 | A1 | 3/2015 | Cha et al. |
| 2016/0315168 | A1 | 10/2016 | Dussarrat et al. |

FOREIGN PATENT DOCUMENTS

| | | | |
|---|---|---|---|
| CN | 109148594 | A | 1/2019 |
| CN | 114783881 | A | 7/2022 |
| JP | 2015-144174 | A | 8/2015 |
| JP | 2016-157875 | A | 9/2016 |
| KR | 102075530 | B1 | 2/2020 |
| KR | 102162885 | B1 | 10/2020 |

*Primary Examiner* — Nikolay K Yushin
(74) *Attorney, Agent, or Firm* — Harness, Dickey & Pierce, P.L.C.

(57) ABSTRACT

A semiconductor device includes a semiconductor pattern, a dielectric layer on the semiconductor pattern, and a conductive pattern on the dielectric layer. Each of the semiconductor pattern and the dielectric layer includes impurities. The dielectric layer includes a concentration profile of impurities including a first variation section including a first concentration of impurities decreasing throughout the dielectric layer toward the semiconductor pattern, and a second variation section including a second concentration of impurities decreasing throughout the dielectric layer toward the semiconductor pattern.

20 Claims, 15 Drawing Sheets

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2023-0127059, filed on Sep. 22, 2023, in the Korean Intellectual Property Office, the entire contents of which are hereby incorporated by reference.

BACKGROUND OF THE INVENTION

Various example embodiments relate to a semiconductor device, and more particularly, to a semiconductor device including two or more dielectric layers formed by different manufacturing processes.

A semiconductor device may include an integrated circuit including metal-oxide-semiconductor field effect transistors (MOSFETs). As sizes and design rules of semiconductor devices have been reduced, MOSFETs have been scaled down. Operating characteristics of semiconductor devices may be deteriorated by reduction in size of MOSFETs. Accordingly, various research is being conducted for semiconductor devices capable of overcoming limitations according to a high integration density of semiconductor devices and of improving performance of semiconductor devices.

SUMMARY

Various example embodiments of the inventive concepts may provide a semiconductor device with improved electrical characteristics, reliability, and a method of manufacturing the same.

In various example embodiments, a semiconductor device may include a semiconductor pattern, a dielectric layer on the semiconductor pattern, and a conductive pattern on the dielectric layer. Each of the semiconductor pattern and the dielectric layer includes impurities. The dielectric layer includes a concentration profile of impurities including a first variation section including a first concentration of impurities decreasing throughout the dielectric layer toward the semiconductor pattern, and a second variation section including a second concentration of impurities decreasing throughout the dielectric layer toward the semiconductor pattern.

In various example embodiments, a semiconductor device may include a semiconductor pattern, a dielectric layer including impurities on the semiconductor pattern, and a conductive pattern on the dielectric layer. The dielectric layer includes a first portion adjacent to the semiconductor pattern, and a second portion between the first portion and the conductive pattern. A thickness of the first portion of the dielectric layer in a direction perpendicular to an interface between the dielectric layer and the semiconductor pattern ranges from 20% to 60% of a total thickness of the dielectric layer. A concentration of impurities decreases throughout the first portion and the second portion of the dielectric layer toward the semiconductor pattern.

In various example embodiments, a semiconductor device may include a bit line extending in a first direction, a semiconductor pattern on the bit line, the semiconductor pattern comprising first and second vertical portions spaced apart in the first direction, a word line on the semiconductor pattern, the word line comprising first and second word lines between the first and second vertical portions and adjacent to the first and second vertical portions, respectively, a dielectric layer between the semiconductor pattern and the word line, and data storage patterns electrically connected to the first and second vertical portions, respectively. Each of the semiconductor pattern and the dielectric layer includes impurities. The dielectric layer includes a concentration profile of impurities. The concentration profile of impurities includes a first variation section including a first concentration of impurities decreasing throughout the dielectric layer toward the semiconductor pattern, and a second variation section including a second concentration of impurities decreasing throughout the dielectric layer toward the semiconductor pattern.

DETAILED DESCRIPTION

Various example embodiments of the inventive concepts will now be described more fully with reference to the accompanying drawings.

Figure 1:
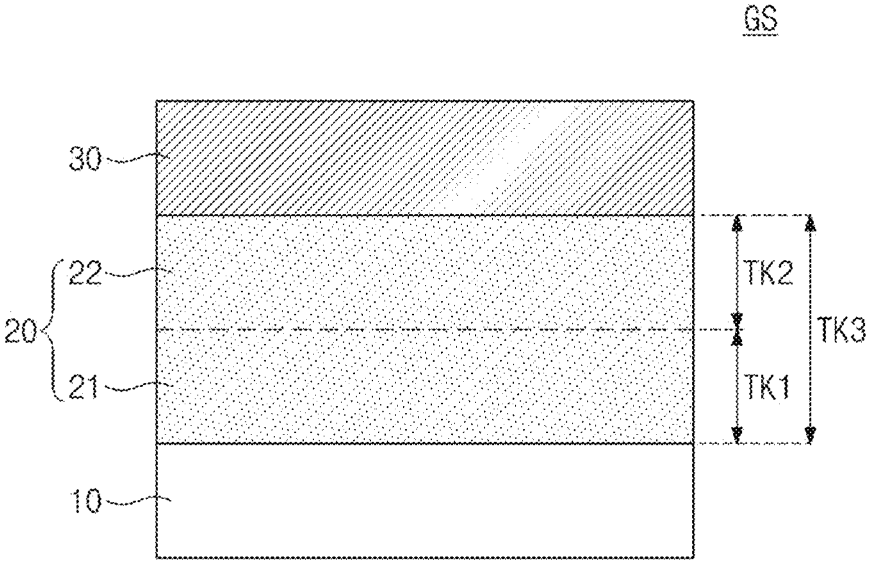
FIG. 1 is a cross-sectional view illustrating a gate structure according to some example embodiments of the inventive concepts.
Figure 2:
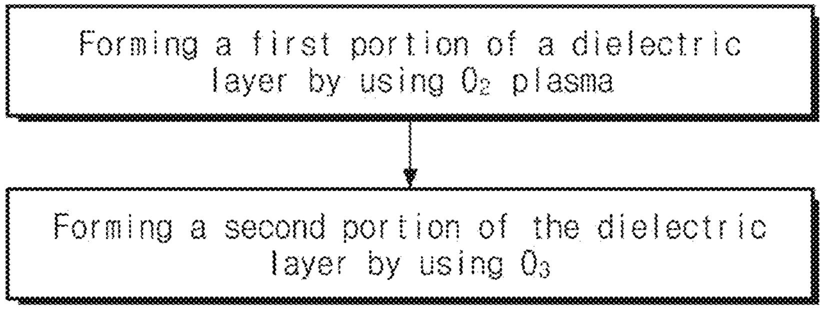
FIG. 2 is a flow chart illustrating a method of manufacturing a gate structure according to some example embodiments of the inventive concepts.
Figure 3:
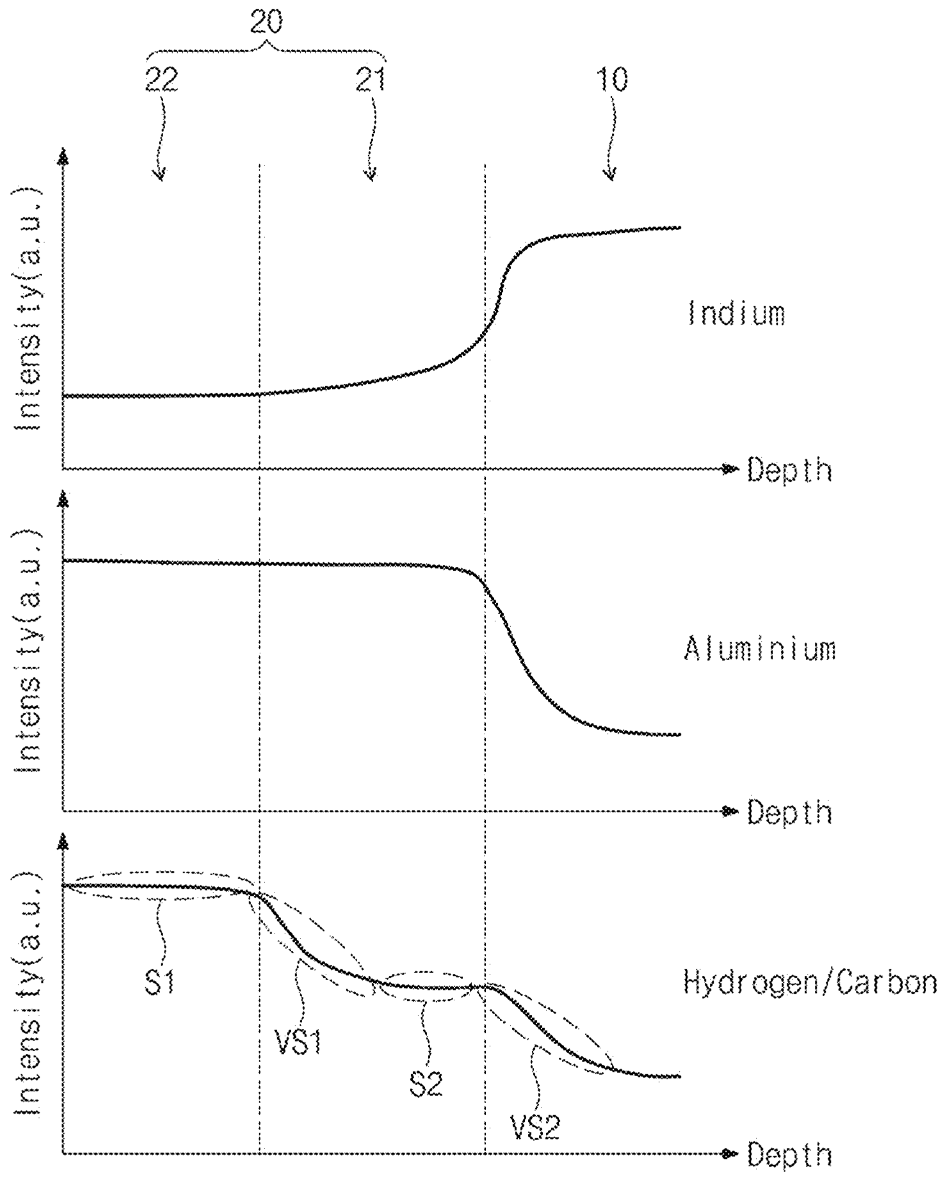
FIG. 3 illustrates graphs showing changes in concentration of materials in regions of the gate structure of FIG. 1.

FIG. 1 is a cross-sectional view illustrating a gate structure according to some example embodiments of the inventive concepts. FIG. 2 is a flow chart illustrating a method of manufacturing a gate structure according to some example embodiments of the inventive concepts. FIG. 3 illustrates graphs showing changes in concentration of materials in regions of the gate structure of FIG. 1.

Referring to FIG. 1, a gate structure GS of a semiconductor device may be provided. For example, the gate structure GS may form a field effect transistor (FET). The gate structure GS may include a semiconductor pattern 10, a conductive pattern 30 on the semiconductor pattern 10, and a dielectric layer 20 between the semiconductor pattern 10 and the conductive pattern 30. For example, the gate structure GS may form a metal-oxide-semiconductor field effect transistor (MOSFET) including the semiconductor pattern 10, the dielectric layer 20 and the conductive pattern 30. The semiconductor pattern 10 may include a pair of source/drain patterns spaced apart from each other, and a channel region between the pair of source/drain patterns. For example, the conductive pattern 30 may be a word line of the semiconductor device, and the conductive pattern 30 may control the channel region of the semiconductor pattern 10.

The semiconductor pattern 10 may include an oxide semiconductor. For example, the oxide semiconductor may include at least one of $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, or $In_xGa_yO$, but example embodiments of the inventive concepts are not limited thereto. For example, the semiconductor pattern 10 may include indium gallium zinc oxide (IGZO). The semiconductor pattern 10 may include a single-layered or multi-layered oxide semiconductor. The semiconductor pattern 10 may include an amorphous, single-crystalline or poly-crystalline oxide semiconductor. In some example embodiments, the semiconductor pattern 10 may have a band gap energy greater than a band gap energy of silicon. For example, the semiconductor pattern 10 may have a band gap energy of about 1.5 eV to about 5.6 eV. For example, optimized channel performance may be realized in a case in which the semiconductor pattern 10 has a band gap energy of about 2.0 eV to about 4.0 eV.

The conductive pattern 30 may include at least one of, but not limited to, a metal (e.g., Al, Cu, Ti, Ta, Ru, W, Mo, Pt, Ni, Co, etc.), a conductive metal nitride (e.g., TiN, TaN, WN, NbN, TiAlN, TiSiN, TaSiN, RuTiN, etc.), a conductive metal silicide, or a conductive metal oxide (e.g., PtO, $RuO_2$, $IrO_2$, $SrRuO_3$ (SRO), (Ba,Sr) $RuO_3$ (BSRO), $CaRuO_3$ (CRO), LSCo, etc.). The conductive pattern 30 may include a single layer or multi-layer having at least one of the aforementioned materials.

The dielectric layer 20 may be disposed between the semiconductor pattern 10 and the conductive pattern 30 to separate them from each other. For example, the dielectric layer 20 may have a substantially uniform thickness in a direction substantially perpendicular to an interface between the semiconductor pattern 10 and the dielectric layer 20. The dielectric layer 20 may include a metal oxide. For example, the dielectric layer 20 may include at least one of hafnium oxide (e.g., $HfO_2$), hafnium silicon oxide (e.g., HfSiO), hafnium silicon oxynitride (e.g., HfSiON), hafnium tantalum oxide (e.g., HfTaO), hafnium titanium oxide (e.g., HfTiO), hafnium zirconium oxide (e.g., HfZrO), zirconium oxide (e.g., $ZrO_2$), or aluminum oxide (e.g., $Al_2O_3$).

The dielectric layer 20 may include a first portion 21 and a second portion 22. The first portion 21 may be provided on the semiconductor pattern 10, and for example, the first portion 21 may be in contact with the semiconductor pattern 10. The second portion 22 may be provided between the first portion 21 and the conductive pattern 30. The second portion 22 may be spaced apart from the semiconductor pattern 10 by the first portion 21. The first portion 21 and the second portion 22 may be portions formed by different processes.

Referring to FIGS. 1 and 2, for example, the first portion 21 may be formed by performing a first deposition process, and the second portion 22 may be formed by performing a second deposition process. The first and second deposition processes may be different kinds of atomic layer deposition (ALD) processes.

The performing of the first deposition process may include forming the first portion 21 of the dielectric layer 20 by using $O_2$ plasma and may include performing a plasma enhanced ALD (PE-ALD) process. For example, the performing of the first deposition process may include depositing a first precursor on the semiconductor pattern 10 and reacting the first precursor with the $O_2$ plasma to form the first portion 21. For example, the first portion 21 may include aluminum oxide (e.g., $Al_2O_3$), and in this case, the first precursor may include a material including aluminum, e.g., trimethyl aluminum (TMA).

The performing of the second deposition process may include forming the second portion 22 of the dielectric layer 20 by using $O_3$ and may include performing a thermal ALD (T-ALD) process. For example, the performing of the second deposition process may include depositing a second precursor on the first portion 21 and reacting the second precursor with the $O_3$ to form the second portion 22. The $O_3$ may be provided in a gaseous state, but example embodiments of the inventive concepts are not limited thereto. The $O_3$ may not be provided in a plasma state but may have a reactivity higher than that of $O_2$ to react with the second precursor. For example, the second portion 22 may include aluminum oxide (e.g., $Al_2O_3$), and in this case, the second precursor may include a material including aluminum, e.g., trimethyl aluminum (TMA).

The second portion 22 may include the same material as the first portion 21. Thus, the second portion 22 may be connected to the first portion 21 without an interface therebetween, but example embodiments of the inventive concepts are not limited thereto. For example, the dielectric layer 20 may extend from the conductive pattern 30 toward the semiconductor pattern 10 without an interface therein.

In some example embodiments, the dielectric layer 20 may further include a third portion formed by performing a third deposition process different from the first and second deposition processes, but example embodiments of the inventive concepts are not limited thereto.

Referring to FIGS. 1 and 3, a portion of the material included in the semiconductor pattern 10 may be diffused into the dielectric layer 20. For example, the semiconductor pattern 10 may include indium (In), and the indium may be diffused into the dielectric layer 20. An indium concentration in the dielectric layer 20 may be lower than an indium concentration in the semiconductor pattern 10, and the indium concentration may decrease rapidly from the semiconductor pattern 10 toward the dielectric layer 20 and further decreasing into the dielectric layer 20.

Meanwhile, a portion of the material included in the dielectric layer 20 may be diffused into the semiconductor pattern 10. For example, the dielectric layer 20 may include aluminum (Al), and the aluminum may be diffused into the semiconductor pattern 10. An aluminum concentration in the semiconductor pattern 10 may be lower than an aluminum concentration in the dielectric layer 20, and the aluminum concentration may decrease rapidly from the dielectric layer 20 toward the semiconductor pattern 10 and further decreasing into the semiconductor pattern 10.

Each of the first and second portions 21 and 22 of the dielectric layer 20 and the semiconductor pattern 10 may include impurities. The impurities may include hydrogen or carbon. For some examples, the impurities may be one of hydrogen and carbon. For certain examples, the impurities may include both hydrogen and carbon.

A concentration of the impurities may be changed as throughout the dielectric layer 20 toward the semiconductor pattern 10 and further decreasing into the semiconductor pattern 10. In various example embodiments, unless otherwise stated, the change in concentration of the impurities according to movement in regions may mean the change in concentration of the impurities throughout the dielectric layer 20 toward the semiconductor pattern 10, and further changing into the semiconductor pattern. For example, the concentration of the impurities may decrease throughout the dielectric layer 20 toward the semiconductor pattern 10 and further decrease into the semiconductor pattern 10.

A concentration profile of the impurities may show a first section S1, a first variation section VS1, a second section S2 and a second variation section VS2 throughout the dielectric layer 20 and into the semiconductor pattern 10. The first section S1 and the second section S2 may be defined in regions corresponding to the second portion 22 and the first portion 21, respectively. The first variation section VS1 may be defined between the second portion 22 and the first portion 21, and the second variation section VS2 may be defined between the first portion 21 and the semiconductor pattern 10. Here, it may be understood that when the first variation section VS1 is defined between the second portion 22 and the first portion 21, it may be defined in a section from a region of the second portion 22 adjacent to an interface between the first and second portions 21 and 22 to a region of the first portion 21 adjacent to the interface. Likewise, the second variation section VS2 may be defined in a section from a region of the first portion 21 adjacent to an interface between the first portion 21 and the semiconductor pattern 10 to a region of the semiconductor pattern 10 adjacent to the interface.

The concentration of the impurities according to the movement in the regions may decrease rapidly in the first variation section VS1 and the second variation section VS2. For example, the concentration of the impurities according to the movement in the regions may decrease more rapidly in the first variation section VS1 and the second variation section VS2 than in the first section S1 and the second section S2. Thus, the concentration profile of the impurities according to the movement in the regions may have a stepped profile.

For example, in the case in which the impurities include both carbon and hydrogen, each of concentration profiles of carbon and hydrogen may show the first section S1, the first variation section VS1, the second section S2, and the second variation section VS2.

The impurities may be provided from the outside in processes of manufacturing a semiconductor device. For example, the impurities may be diffused from the outside into the second portion 22, the first portion 21 and the semiconductor pattern 10 in the order named. Thus, the concentration of the impurities may decrease throughout the second portion 22, the first portion 21 and the semiconductor pattern 10 in the order named.

A solubility of the impurities in the second portion 22 may be greater than a solubility of the impurities in the first portion 21. Thus, the first variation section VS1 in which the concentration of the impurities decreases rapidly may be shown between the second portion 22 and the first portion 21. For example, the second variation section VS2 may be shown due to solubility or a boundary between the first portion 21 and the semiconductor pattern 10, but example embodiments of the inventive concepts are not limited thereto.

When the impurities are diffused into the semiconductor pattern 10, the impurities may have unexpected effects on a carrier concentration or oxygen vacancies of the semiconductor pattern 10, and thus electrical characteristics and reliability of a semiconductor device may be deteriorated. However, the second portion 22 may have high solubility to prevent or reduce the impurities from being diffused into the semiconductor pattern 10, and thus electrical characteristics and reliability of the semiconductor device may be improved.

Each of the first portion 21 and the second portion 22 may include a metal oxide, and the first portion 21 may diffuse a metal material of the metal oxide into the semiconductor pattern 10 better than the second portion 22. For example, each of the first portion 21 and the second portion 22 may include aluminum oxide (e.g., $Al_2O_3$), and the first portion 21 may diffuse aluminum into the semiconductor pattern 10 better than the second portion 22. Since the metal material (e.g., aluminum) is diffused into the semiconductor pattern 10, electrical characteristics (e.g., on/off characteristics) of the semiconductor device may be improved. As a result, the dielectric layer 20 may include the first portion 21 and the second portion 22, and thus the electrical characteristics and reliability of the semiconductor device may be improved.

In addition, the first portion 21 may be formed adjacent to the semiconductor pattern 10, and thus the metal material may be effectively diffused into the semiconductor pattern 10. Since the second portion 22 is spaced apart from the semiconductor pattern 10, it is possible to effectively prevent or reduce a large amount of the impurities provided in the second portion 22 from being diffused into the semiconductor pattern 10.

Referring again to FIG. 1, the first portion 21 may have a first thickness TK1 in a vertical direction substantially perpendicular to the interface between the dielectric layer 20 and the semiconductor pattern 10, and the second portion 22 may have a second thickness TK2 in the vertical direction. The dielectric layer 20 may have a third thickness TK3 in the vertical direction, and for example, the third thickness TK3 may be a sum of the first thickness TK1 and the second thickness TK2.

The first thickness TK1 may range from 20% to 60% of the third thickness TK3. The second thickness TK2 may range from 40% to 80% of the third thickness TK3. The first thickness TK1 may range from 15 Å to 40 Å. The second thickness TK2 may range from 25 Å to 100 Å.

To prevent or reduce reduction in dielectric constant of the dielectric layer 20, the third thickness TK3 of the dielectric layer 20 may be limited to a desired (or, alternatively an empirically or predetermined) value or less. Thus, the sum of the first thickness TK1 and the second thickness TK2 may also be limited to the desired (or, alternatively an empirically or predetermined) value or less. For example, if the first thickness TK1 is too thick (i.e., the second thickness TK2 is too thin), the ability of the second portion 22 to prevent or reduce the diffusion of the impurities may be reduced, which may result in a deterioration of the electrical characteristics and reliability of the semiconductor device. For example, if the first thickness TK1 is greater than 60% of the third thickness TK3 (i.e., the second thickness TK2 is less than 40% of the third thickness TK3), electrical characteristics and reliability of the semiconductor device may be deteriorated due to the diffusion of the impurities. For example, if the second thickness TK2 is too thick (i.e., the first thickness TK1 is too thin), the diffusion of the metal material into the semiconductor pattern 10 by the first portion 21 may be reduced, which may deteriorate the electrical characteristics of the semiconductor device. For example, if the first thickness TK1 is less than 20% of the third thickness TK3 (i.e., the second thickness TK2 is greater than 80% of the third thickness TK3), electrical characteristics of the semiconductor device may be deteriorated due to the reduction of the diffusion of the metal material.

The gate structure GS may be applied to a semiconductor device including a MOS field effect transistor without limitations. Hereinafter, a semiconductor device including the gate structure according to some example embodiments of the inventive concepts will be described as an example with reference to FIGS. 4 to 6.

Figure 4:
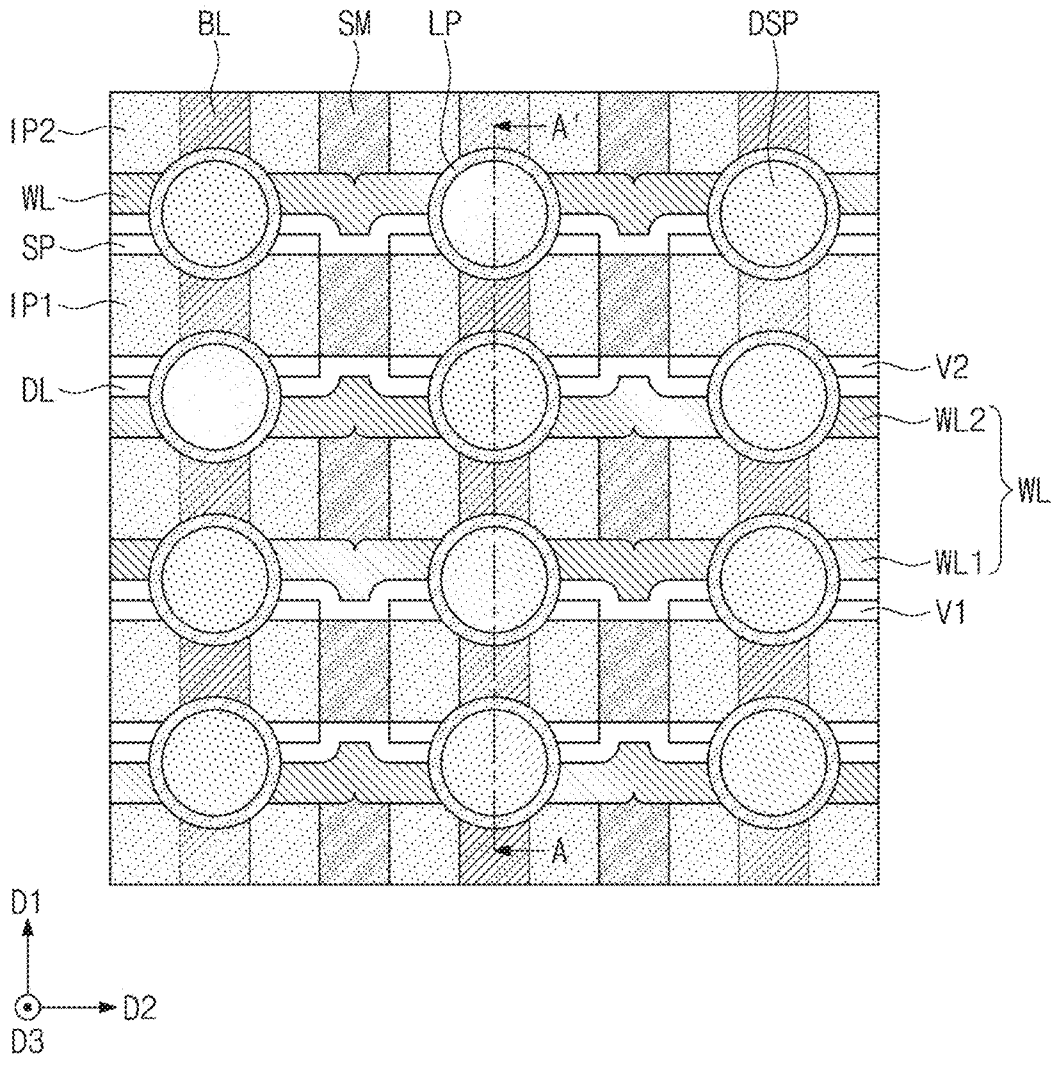
FIG. 4 is a plan view illustrating a semiconductor device including a gate structure according to some example embodiments of the inventive concepts.
Figure 5:
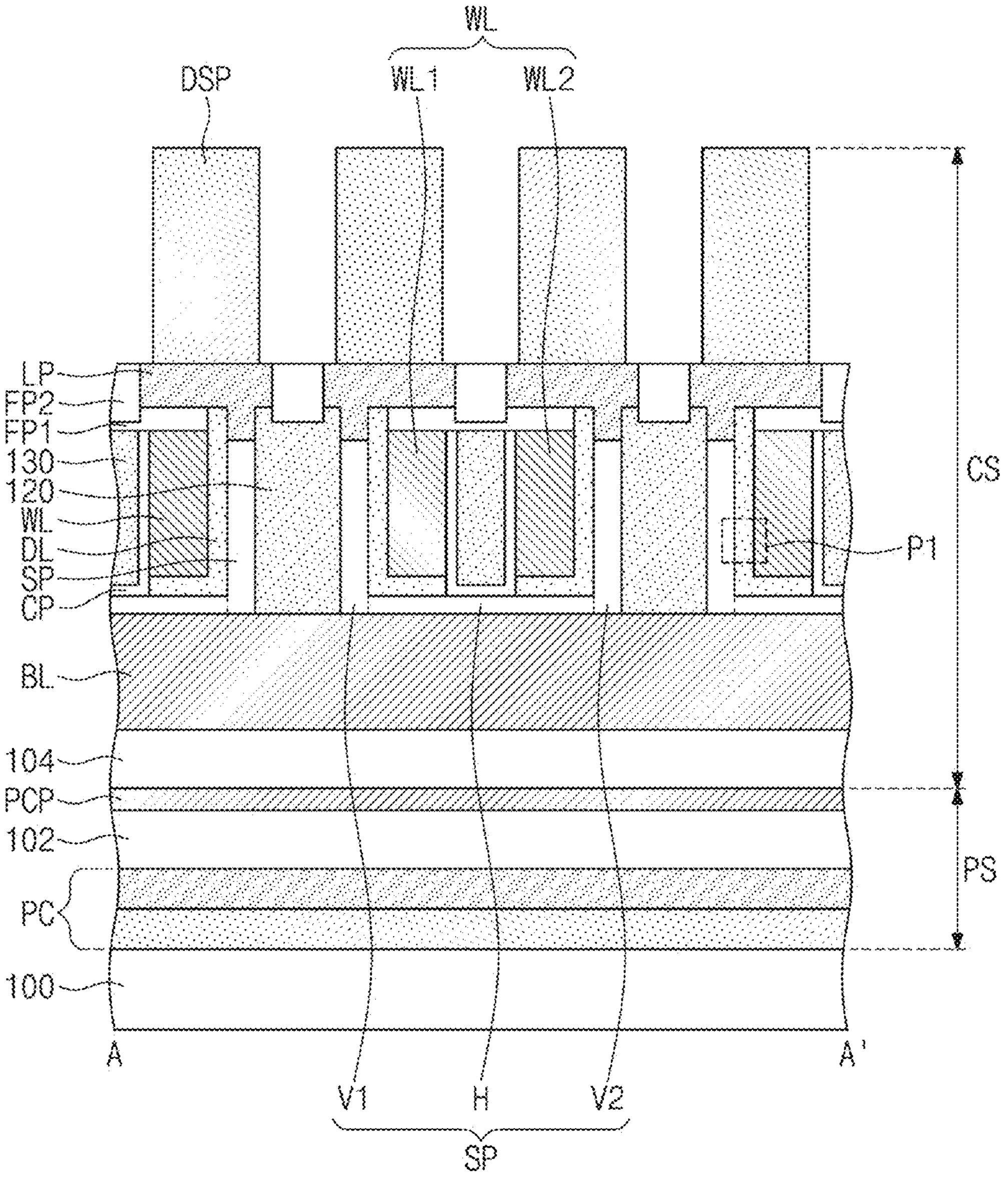
FIG. 5 is a cross-sectional view corresponding to a line A-A' of FIG. 4.
Figure 6:
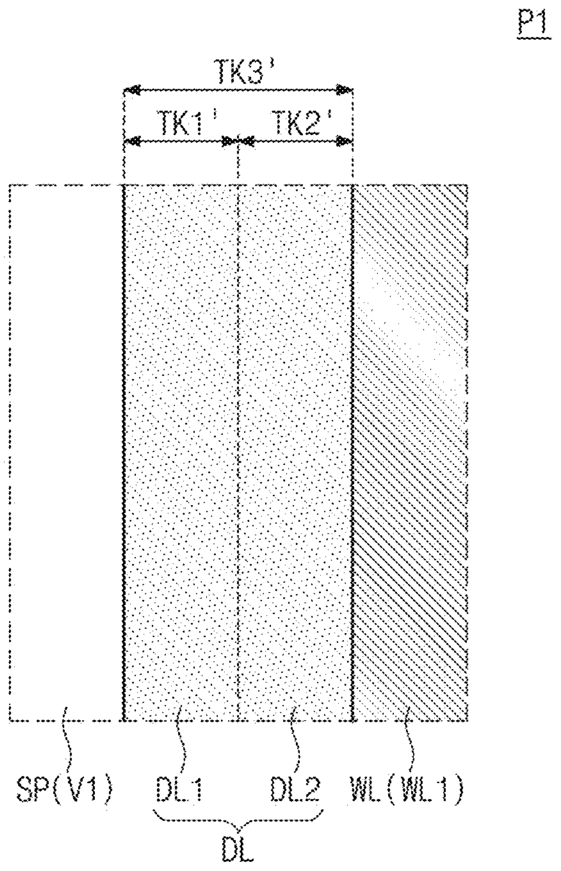
FIG. 6 is an enlarged view corresponding to a portion 'P1' of FIG. 5.

FIG. 4 is a plan view illustrating a semiconductor device including a gate structure according to some example embodiments of the inventive concepts. FIG. 5 is a cross-sectional view corresponding to a line A-A' of FIG. 4. FIG. 6 is an enlarged view corresponding to a portion 'P1' of FIG. 5.

Referring to FIGS. 4 to 6, a semiconductor device may include a substrate 100, a peripheral circuit structure PS on the substrate 100, and a cell array structure CS on the peripheral circuit structure PS.

The substrate 100 may be a semiconductor substrate. For example, the substrate 100 may be a silicon substrate, a germanium substrate, or a silicon-germanium substrate.

The peripheral circuit structure PS may include a peripheral gate structure PC integrated on the substrate 100, peripheral contact pads PCP, peripheral contact plugs (not shown), and a first interlayer insulating layer 102 covering them. The peripheral gate structure PC may form a circuit such as a sense amplifier.

The cell array structure CS may include memory cells including vertical channel transistors. The cell array structure CS may include a plurality of cell contact plugs (not shown), a plurality of bit lines BL, a plurality of shielding structures SM, a second interlayer insulating layer 104, a plurality of semiconductor patterns SP, a plurality of word lines WL, a plurality of dielectric layers DL, and data storage patterns DSP. The semiconductor pattern SP, the dielectric layer DL and the word line WL according to the various example embodiments may respectively correspond to the semiconductor pattern 10, the dielectric layer 20 and the conductive pattern 30, described with reference to FIG. 1.

Each of the first and second interlayer insulating layers 102 and 104 may include a plurality of stacked insulating layers and may include at least one of, for example, silicon oxide, silicon nitride, silicon oxynitride, or a low-k dielectric material. However, example embodiments are not limited thereto.

The bit line BL may be provided on the substrate 100 and may extend in a first direction D1 parallel to a bottom surface of the substrate 100. The bit line BL may be provided in plurality, and the bit lines BL may be spaced apart from each other in a second direction D2. The second direction D2 may be a direction which is parallel to the bottom surface of the substrate 100 and intersects the first direction D1. The bit line BL may be electrically connected to the peripheral contact pad PCP through the cell contact plug.

For example, the bit line BL may include at least one of doped poly-silicon, a metal (e.g., Al, Cu, Ti, Ta, Ru, W, Mo, Pt, Ni, Co, etc.), a conductive metal nitride (e.g., TiN, TaN, WN, NbN, TiAlN, TiSiN, TaSiN, RuTiN, etc.), a conductive metal silicide, or a conductive metal oxide (e.g., PtO, $RuO_2$, $IrO_2$, $SrRuO_3$ (SRO), (Ba,Sr) $RuO_3$ (BSRO), $CaRuO_3$ (CRO), LSCo, etc.), but example embodiments of the inventive concepts are not limited thereto. The bit line BL may include a single layer or multi-layer including at least one of the aforementioned materials. In some example embodiments, the bit line BL may include a two-dimensional material, and for example, the two-dimensional material may include at least one of graphene or carbon nanotube. However, example embodiments are not limited thereto.

Each of the shielding structures SM may be provided between the bit lines BL adjacent to each other, and the shielding structures SM may extend in the first direction D1. For example, the shielding structures SM may include a conductive material such as a metal. The shielding structures SM may be provided in the second interlayer insulating layer 104.

In some example embodiments, each of the shielding structures SM may be formed of the conductive material and may include an air gap or a void therein. In some example embodiments, even though not shown in the drawings, air gaps may be provided in the second interlayer insulating layer 104 instead of the shielding structures SM.

The semiconductor pattern SP may be disposed on the bit line BL. The semiconductor pattern SP may be provided in plurality. The semiconductor patterns SP may be spaced apart from each other in the first and second directions D1 and D2.

In some example embodiments, the semiconductor pattern SP may include a first vertical portion V1 and a second vertical portion V2, which are spaced apart from each other in a horizontal direction. In some example embodiments, the semiconductor pattern SP may further include a horizontal portion H connecting the first and second vertical portions V1 and V2. The horizontal portion H may be disposed between lower portions of the first and second vertical portions V1 and V2 to connect the first and second vertical portions V1 and V2.

The horizontal portion H of the semiconductor pattern SP may include a common source/drain region, and upper portions of the first and second vertical portions V1 and V2 may include first and second source/drain regions, respectively. The first vertical portion V1 may include a first channel region between the common source/drain region and the first source/drain region, and the second vertical portion V2 may include a second channel region between the common source/drain region and the second source/drain region. Each of the first and second vertical portions V1 and V2 may be electrically connected to the bit line BL. In other words, the semiconductor device according to various example embodiments may have a structure in which a pair of vertical channel transistors shares a single bit line BL.

The word line WL may be disposed between the first vertical portion V1 and the second vertical portion V2. The word line WL may be provided in plurality. The word lines WL may extend in the second direction D2 and may be spaced apart from each other in the first direction D1.

Each of the word lines WL may include a first word line WL1 and a second word line WL2, and the first word line WL1 and the second word line WL2 may be spaced apart from each other in the first direction D1. The first word line WL1 may cover an inner side surface of the first vertical portion V1, and the inner side surface of the first vertical portion V1 may be a side surface of the first vertical portion V1, which faces the second vertical portion V2.

The first word line WL1 may be adjacent to the first channel region of the first vertical portion V1 and may control the first channel region. The second word line WL2 may cover an inner side surface of the second vertical portion V2, and the inner side surface of the second vertical portion V2 may be a side surface of the second vertical portion V2, which faces the first vertical portion V1. The second word line WL2 may be adjacent to the second channel region of the second vertical portion V2 and may control the second channel region.

The dielectric layer DL may be disposed between the semiconductor pattern SP and the word line WL. More particularly, the dielectric layer DL may be disposed between the inner side surface of the first vertical portion V1 and the first word line WL1 and between the inner side surface of the second vertical portion V2 and the second word line WL2. The dielectric layer DL may further extend between the horizontal portion H and the word line WL. The word line WL may be spaced apart from the semiconductor pattern SP by the dielectric layer DL. The dielectric layer DL may cover the semiconductor pattern SP with a substantially uniform thickness.

The dielectric layer DL may include a first portion DL1 and a second portion DL2.

The first portion DL1 may be provided on the semiconductor pattern SP, and for example, the first portion DL1 may be in contact with the semiconductor pattern SP. The second portion DL2 may be provided between the first portion DL1 and the word line WL. The second portion DL2 may be spaced apart from the semiconductor pattern SP by the first portion DL1. The first portion DL1 and the second portion DL2 may be portions formed by different processes. Each of the dielectric layer DL and the semiconductor pattern SP may include impurities. The impurities may include hydrogen or carbon.

Features relating to various aspects of the first portion DL1, the second portion DL2, and the semiconductor pattern SP are described with reference to FIGS. 1 to 3. For example, changes in concentration of materials in the first portion DL1 and the second portion DL2 of the dielectric layer DL and the semiconductor pattern SP, manufacturing processes of DL1, DL2 and SP. Furthermore, thicknesses of them DL1, DL2 and SP may be the same/similar as the features of the first portion 21 and the second portion 22 of the dielectric layer 20 and the semiconductor pattern 10.

Referring to FIG. 6, the first portion DL1 may have a first thickness TK1' in a direction perpendicular to an interface between the semiconductor pattern SP and the dielectric layer DL, and the second portion DL2 may have a second thickness TK2' in the perpendicular direction. The dielectric layer DL may have a third thickness TK3' in the perpendicular direction, and for example, the third thickness TK3' may be a sum of the first thickness TK1' and the second thickness TK2'.

The first thickness TK1' may range from 20% to 60% of the third thickness TK3'. The second thickness TK2' may range from 40% to 80% of the third thickness TK3'. The first thickness TK1' may range from 15 Å to 40 Å. The second thickness TK2' may range from 25 Å to 100 Å.

A first insulating pattern 120 may be disposed between the semiconductor patterns SP adjacent to each other in the first direction D1. The first insulating pattern 120 may be provided in plurality. The first insulating patterns 120 may extend in the second direction D2 to intersect the bit line BL and may be spaced apart from each other in the first direction D1. The first insulating pattern 120 may cover at least portions of outer side surfaces of the first and second vertical portions V1 and V2. For example, the first insulating pattern 120 may include at least one of silicon oxide, silicon nitride, silicon oxynitride, or a low-k dielectric material. However, example embodiments are not limited thereto. For example, the first insulating pattern 120 may have a single-layered or multi-layered structure.

A second insulating pattern 130 may be disposed between the first word line WL1 and the second word line WL2 of the word line WL. The second insulating pattern 130 may be provided in plurality. The second insulating patterns 130 may extend in the second direction D2 to intersect the bit line BL and may be spaced apart from each other in the first direction D1. The first and second insulating patterns 120 and 130 may be alternately arranged in the first direction D1. For example, the second insulating pattern 130 may include at least one of silicon oxide, silicon nitride, silicon oxynitride, or a low-k dielectric material. However, example embodiments are not limited thereto.

A capping pattern CP may be disposed between the word line WL and the second insulating pattern 130. The capping pattern CP may cover an inner side surface of the word line WL. For example, the capping pattern CP may include at least one of silicon oxide, silicon nitride, or silicon oxynitride. However, example embodiments are not limited thereto.

A first filling pattern FP1 may be provided on a top surface of the word line WL. The first filling pattern FP1 may cover top surfaces of the capping pattern CP and the second insulating pattern 130. The first filling pattern FP1 may extend in the second direction D2. For example, the first filling pattern FP1 may include at least one of silicon oxide, silicon nitride, or silicon oxynitride. However, example embodiments are not limited thereto.

Landing pads LP may be provided on the first and second vertical portions V1 and V2 of the semiconductor pattern SP, respectively. The landing pads LP may be in direct contact with the first and second vertical portions V1 and V2 and may be electrically connected to the first and second vertical portions V1 and V2. The landing pads LP may be spaced apart from each other in the first and second directions D1 and D2 and may be arranged in one of various forms such as a matrix form, a zigzag form and a honeycomb form, when viewed in a plan view. Each of the landing pads LP may have one of various shapes such as a circular shape, an elliptical shape, a rectangular shape, a square shape, a lozenge shape and a hexagonal shape, when viewed in a plan view. However, example embodiments are not limited thereto.

For example, the landing pads LP may be formed of doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof, but example embodiments of the inventive concepts are not limited thereto.

A second filling pattern FP2 may fill a space between the landing pads LP on the first and second insulating patterns 120 and 130. For example, the second filling pattern FP2 may include at least one of silicon oxide, silicon nitride, or silicon oxynitride and may include a single layer or a multi-layer. However, example embodiments are not limited thereto.

The data storage patterns DSP may be provided on the landing pads LP, respectively. The data storage patterns DSP may be electrically connected to the first and second vertical portions V1 and V2 of the semiconductor pattern SP through the landing pads LP, respectively.

In some example embodiments, each of the data storage patterns DSP may be a capacitor and may include lower and upper electrodes and a capacitor dielectric layer disposed therebetween. In this case, the lower electrode may be in contact with the landing pad LP, and the lower electrode may have at least one of various shapes such as a circular shape, an elliptical shape, a rectangular shape, a square shape, a lozenge shape and a hexagonal shape when viewed in a plan view. However, example embodiments are not limited thereto.

Alternatively, each of the data storage patterns DSP may be a variable resistance pattern switchable between two resistance states by an electrical pulse applied thereto. For example, the data storage patterns DSP may include at least one of a phase-change material of which a crystal state is changeable such as, a perovskite compound, a transition metal oxide, a magnetic material, a ferromagnetic material, or an antiferromagnetic material. However, example embodiments are not limited thereto.

Hereinafter, characteristics and effects of the semiconductor device according to the inventive concepts will be described in more detail with reference to experimental examples.

A MOS field effect transistor including the gate structure GS according to the inventive concepts was realized in each of experimental examples 1 to 6. Each of the MOS field effect transistors of the experimental examples 1 to 6 was realized by forming components on silicon oxide having a thickness of 100 nm. IGZO having a thickness of 10 nm was formed by a PE-ALD process, and ITO having a thickness of 100 nm was sputtered at both sides of the IGZO to form source/drain electrodes. Aluminum oxide ($Al_2O_3$) having a thickness of 15 nm was formed as the dielectric layer by sequentially performing a PE-ALD process and a T-ALD process, and ITO having a thickness of 100 nm was sputtered thereon to form a gate electrode. Thickness ratios of the aluminum oxides ($Al_2O_3$) formed by the PE-ALD and T-ALD processes in the experimental examples 1 to 6 are shown in the following table 1.

TABLE 1

| | PE-ALD ratio (thickness) | T-ALD ratio (thickness) | Total ratio (thickness) |
|---|---|---|---|
| Experimental example 1 | 0% (0 nm) | 100% (15 nm) | 100% (15 nm) |
| Experimental example 2 | 6.7% (1 nm) | 93.3% (14 nm) | 100% (15 nm) |
| Experimental example 3 | 20% (3 nm) | 80% (12 nm) | 100% (15 nm) |
| Experimental example 4 | 46.7% (7 nm) | 53.3% (8 nm) | 100% (15 nm) |
| Experimental example 5 | 73.3% (11 nm) | 26.7% (4 nm) | 100% (15 nm) |
| Experimental example 6 | 100% (15 nm) | 0% (0 nm) | 100% (15 nm) |

Figure 7:
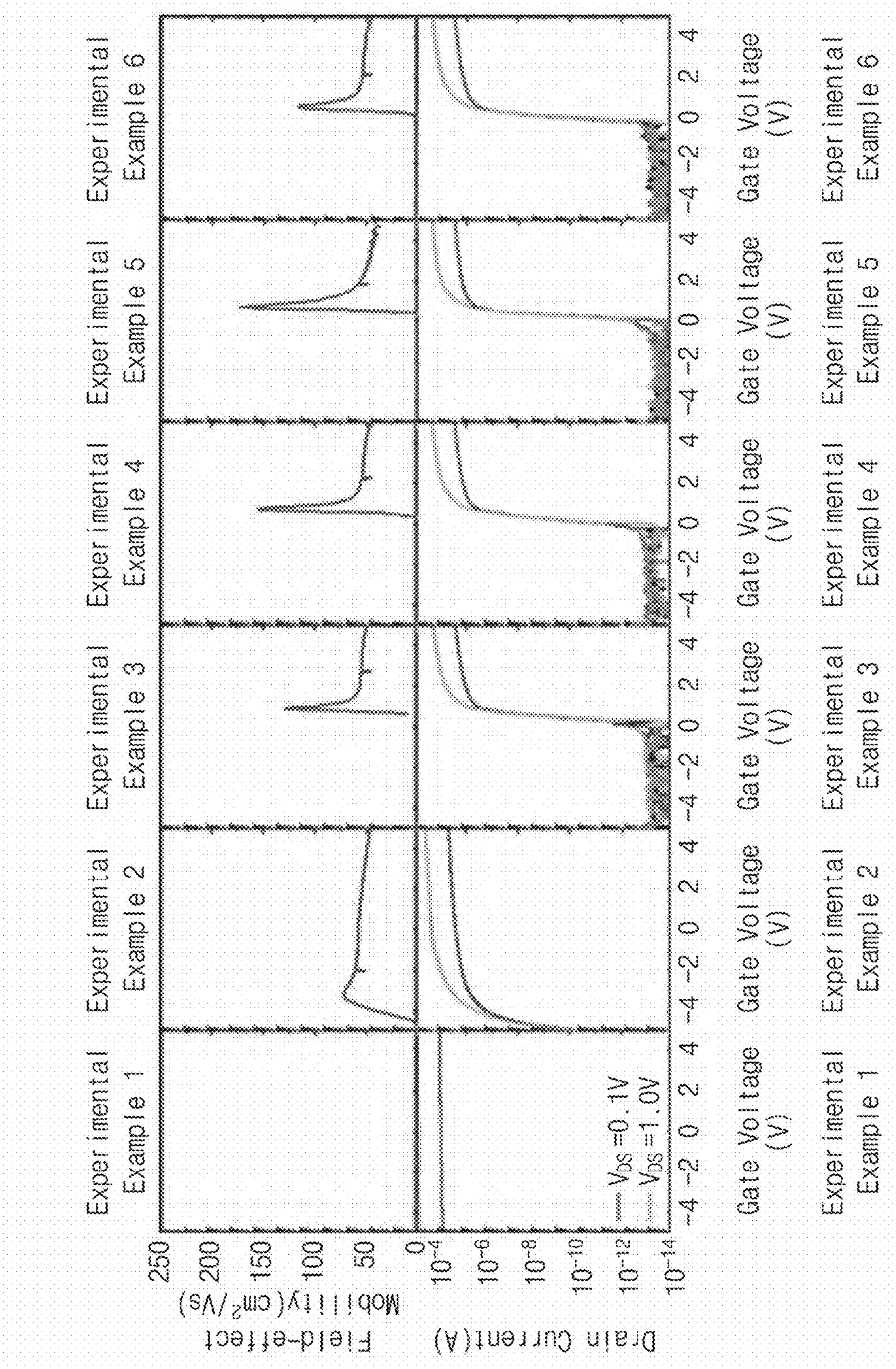
FIG. 7 illustrates graphs showing electrical characteristics of transistors according to components of a dielectric layer.

FIG. 7 illustrates graphs showing electrical characteristics of transistors according to components of a dielectric layer.

Referring to FIG. 7, threshold voltages of the experimental examples 1 and 2 were negative values greatly lower than 0V. Threshold voltages of the experimental examples 3 to 6 were near to 0V. In other words, in the case in which the thickness of $Al_2O_3$ formed by the PE-ALD process was 20% or more, the experimental examples had threshold voltages near to 0V, and the semiconductor device had electrical characteristics appropriate for driving.

In charge mobility, the experimental examples 3 to 5 in which the thickness of $Al_2O_3$ formed by the PE-ALD process was relatively similar to the thickness of $Al_2O_3$ formed by the T-ALD process had high values. Thus, it may be recognized that the mobility is maximized by appropriately adjusting the PE-ALD process and the T-ALD process.

Figure 8:
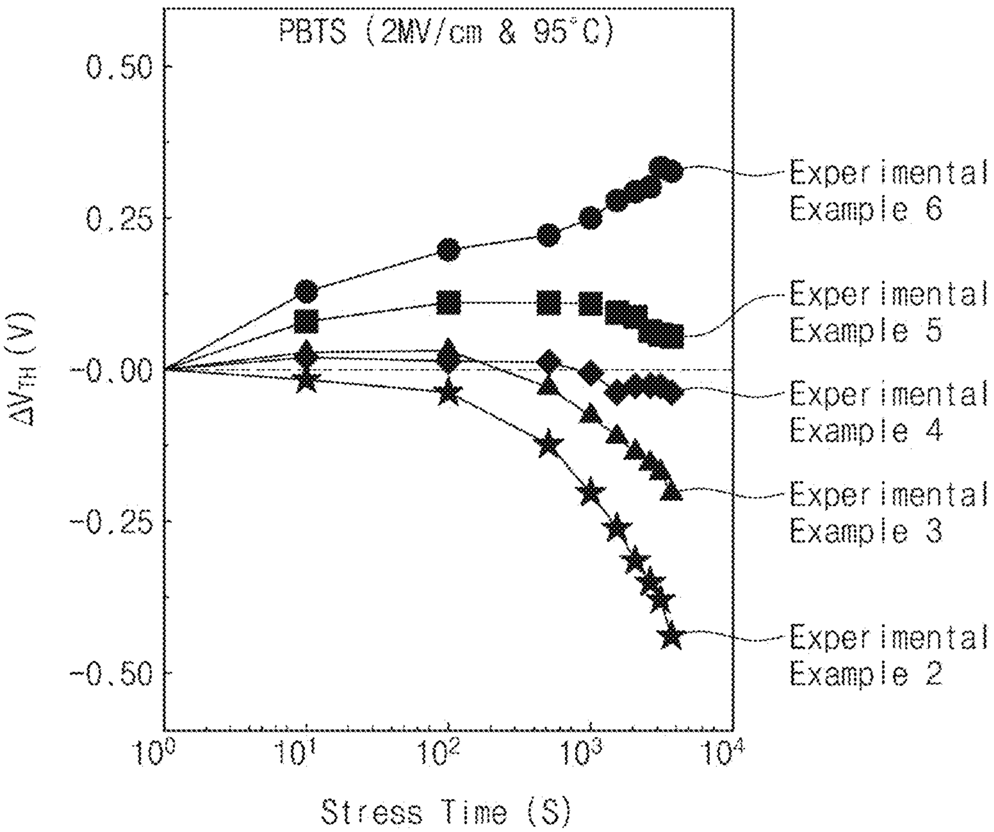
FIG. 8 is a graph showing results of positive-bias temperature stress (PBTS) reliability evaluation of transistors according to components of a dielectric layer.

FIG. 8 is a graph showing results of positive-bias temperature stress (PBTS) reliability evaluation of transistors according to components of a dielectric layer.

Referring to FIG. 8, PBTS evaluation was performed by providing an electric field (i.e., stress) of 2 MV/cm to each of the experimental examples at 95° C. A change in threshold voltage of the experimental example 4 was close to 0V even though the stress was applied for 3600 s. Changes in threshold voltage of the experimental examples 3 and 5 were lower than those of other experimental examples after the stress was applied for 3600 s. Thus, it may be recognized that the change in threshold voltage according to the stress is minimized by appropriately adjusting the PE-ALD process and the T-ALD process.

Figure 9:
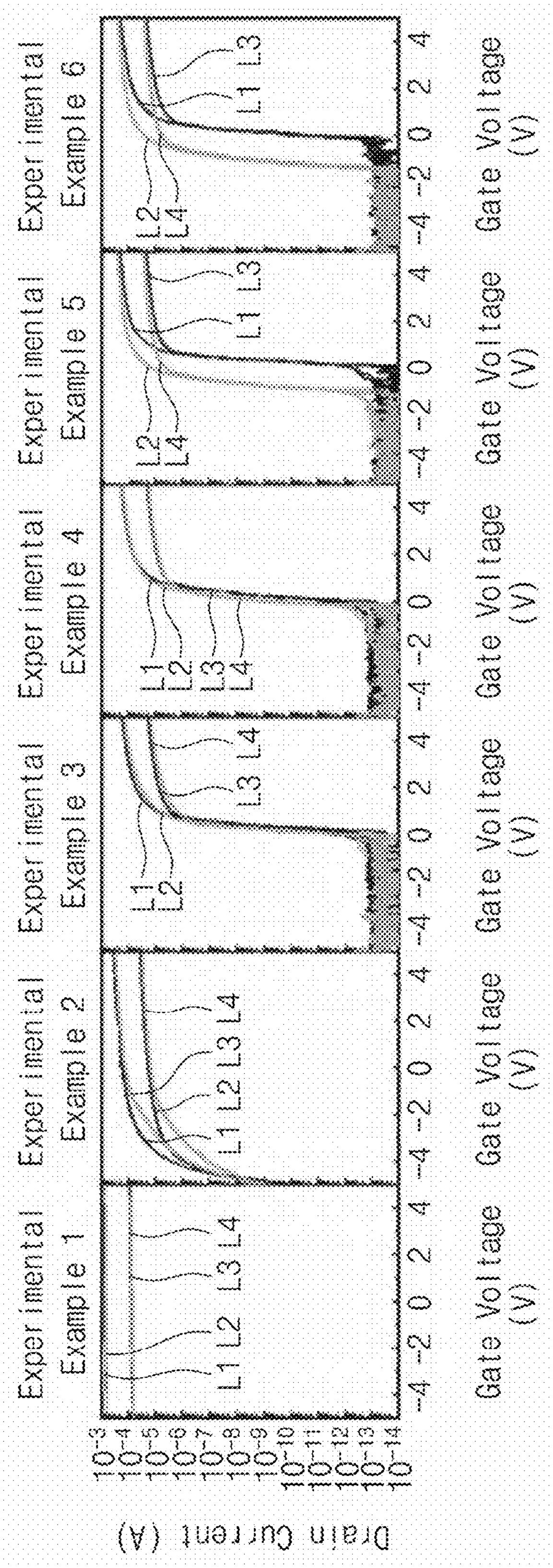
FIG. 9 illustrates graphs showing electrical characteristics of transistors according to whether a hydrogen thermal treatment is applied or not.

FIG. 9 illustrates graphs showing electrical characteristics of transistors according to whether a hydrogen thermal treatment is applied or not.

Referring to FIG. 9, each of lines L1 and L2 in the graphs shows a drain current according to a gate voltage when $V_{DS}$ is 1V, and each of lines L3 and L4 in the graphs shows a drain current according to a gate voltage when $V_{DS}$ is 0.1V. The lines L1 and L3 show drain current values of each of the experimental examples not processed by a hydrogen thermal treatment, and the lines L2 and L4 show drain current values of each of the experimental examples processed by the hydrogen thermal treatment.

Comparing the lines L1 and L2 in the experimental examples 3 to 6 having the threshold voltages near to 0V, it may be recognized that the threshold voltage is reduced by the hydrogen thermal treatment. Comparing the lines L3 and L4, it may also be recognized that the threshold voltage is reduced by the hydrogen thermal treatment. Here, as the thickness of the $Al_2O_3$ formed by the PE-ALD process increases, the reduction in threshold voltage increases. In other words, as the thickness of the $Al_2O_3$ formed by the T-ALD process increases, the reduction in threshold voltage decreases. This may mean that the $Al_2O_3$ formed by the T-ALD process effectively prevents or reduces hydrogen impurities provided by the hydrogen thermal treatment from being diffused into the IGZO and prevents or reduces deterioration (e.g., a change in threshold voltage) of reliability.

Figure 10:
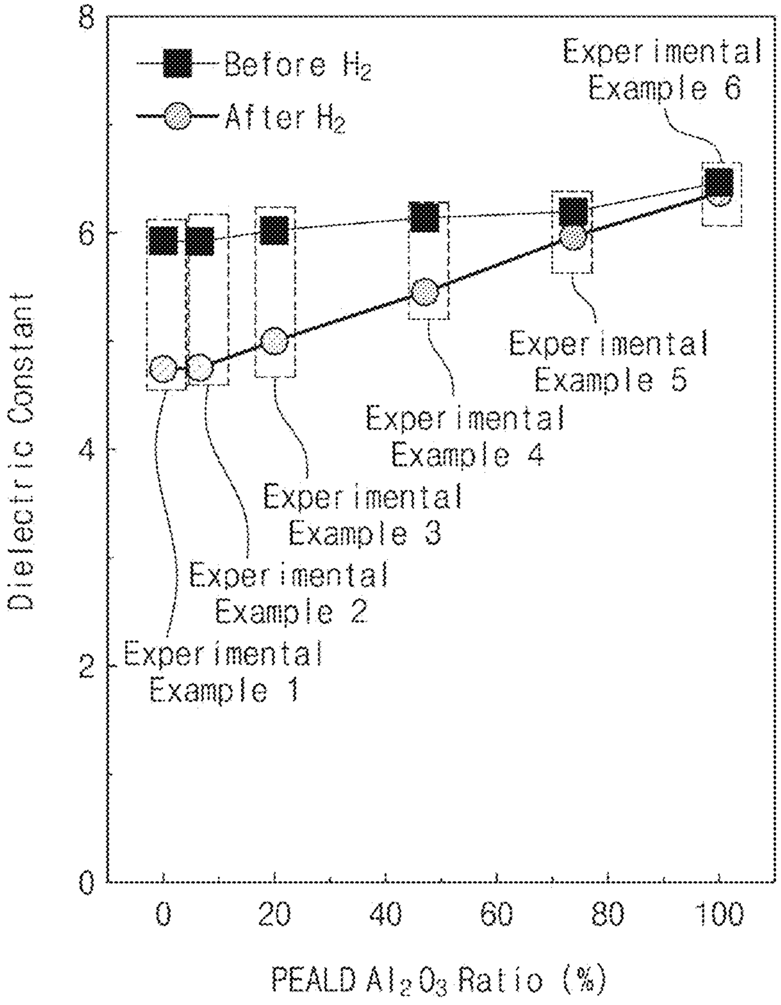
FIG. 10 is a graph showing dielectric constants of dielectric layers according to whether a hydrogen thermal treatment is applied or not.

FIG. 10 is a graph showing dielectric constants of dielectric layers according to whether a hydrogen thermal treatment is applied or not.

Referring to FIG. 10, before the hydrogen thermal treatment, the dielectric layers of the experimental examples had dielectric constants similar to each other. However, after the hydrogen thermal treatment, a reduction in dielectric constant increases as the thickness of the $Al_2O_3$ formed by the T-ALD process increases. This may mean that the $Al_2O_3$ formed by the T-ALD process absorbs more hydrogen than the $Al_2O_3$ formed by the PE-ALD process and the dielectric constant is reduced due to a large amount of hydrogen absorbed in a thin layer as the thickness of the $Al_2O_3$ formed by the T-ALD process increases.

Figure 11:
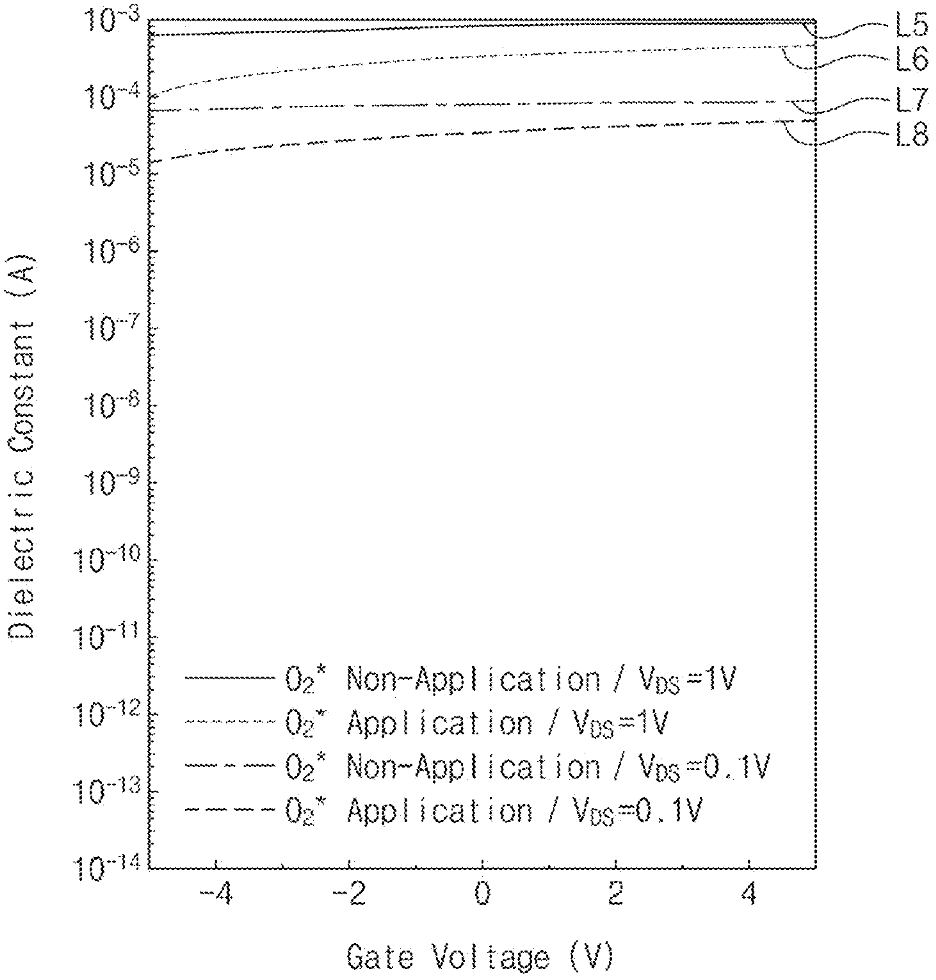
FIG. 11 is a graph showing electrical characteristics of transistors according to whether an $O_2$ plasma treatment is applied or not.

FIG. 11 is a graph showing electrical characteristics of transistors according to whether an $O_2$ plasma treatment is applied or not.

Referring to FIG. 11, drain currents according to application/non-application of an $O_2$ plasma treatment and a $V_{DS}$ value of the experimental example 1 were shown. Each of lines L5 and L6 shows a drain current according to a gate voltage when the $V_{DS}$ is 1V, and each of lines L7 and L8 shows a drain current according to a gate voltage when the $V_{DS}$ is 0.1V. Here, the lines L5 and L7 show a case in which the $O_2$ plasma treatment was not performed before the T-ALD process, and the lines L6 and L8 show a case in which the $O_2$ plasma treatment was performed on the IGZO before the T-ALD process. The $O_2$ plasma treatment was performed at 200° C. for 140s.

As a result of the experiment, the threshold voltage of the experimental example 1 was not near to 0V even though the application/non-application of the $O_2$ plasma treatment and the $V_{DS}$ value were adjusted. This may mean that the $O_2$ plasma treatment hardly affects formation of the threshold voltage near to 0V. Thus, it may be recognized that application/non-application of the $O_2$ plasma treatment in the PE-ALD process does not cause the formation of the threshold voltage near to 0V by the combination of the $Al_2O_3$ formed by the PE-ALD process and the $Al_2O_3$ formed by the T-ALD process.

Figure 12:
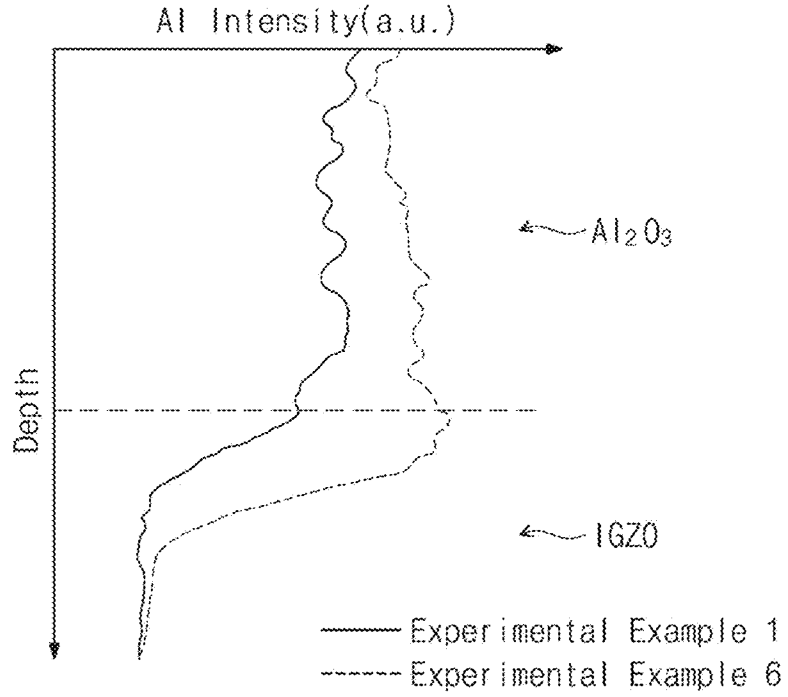
FIG. 12 is a graph showing changes in aluminum concentration in regions of transistors according to components of a dielectric layer.

FIG. 12 is a graph showing changes in aluminum concentration in regions of transistors according to components of a dielectric layer.

Referring to FIG. 12, the IGZO of the experimental example 1 has a higher Al concentration in a place near to the $Al_2O_3$ than the IGZO of the experimental example 6. In other words, the IGZO when the $Al_2O_3$ formed by the PE-ALD process is formed on the IGZO may have a higher Al concentration than the IGZO when the $Al_2O_3$ formed by the T-ALD process is formed on the IGZO. Thus, it may be recognized that the $Al_2O_3$ formed by the PE-ALD process diffuses more Al into the IGZO than the $Al_2O_3$ formed by the T-ALD process. The Al diffused into the IGZO may affect a threshold voltage value, and the Al may be effectively diffused by the $Al_2O_3$ formed by the PE-ALD process to improve electrical characteristics (e.g., on/off characteristics) of the semiconductor device.

Figure 13:
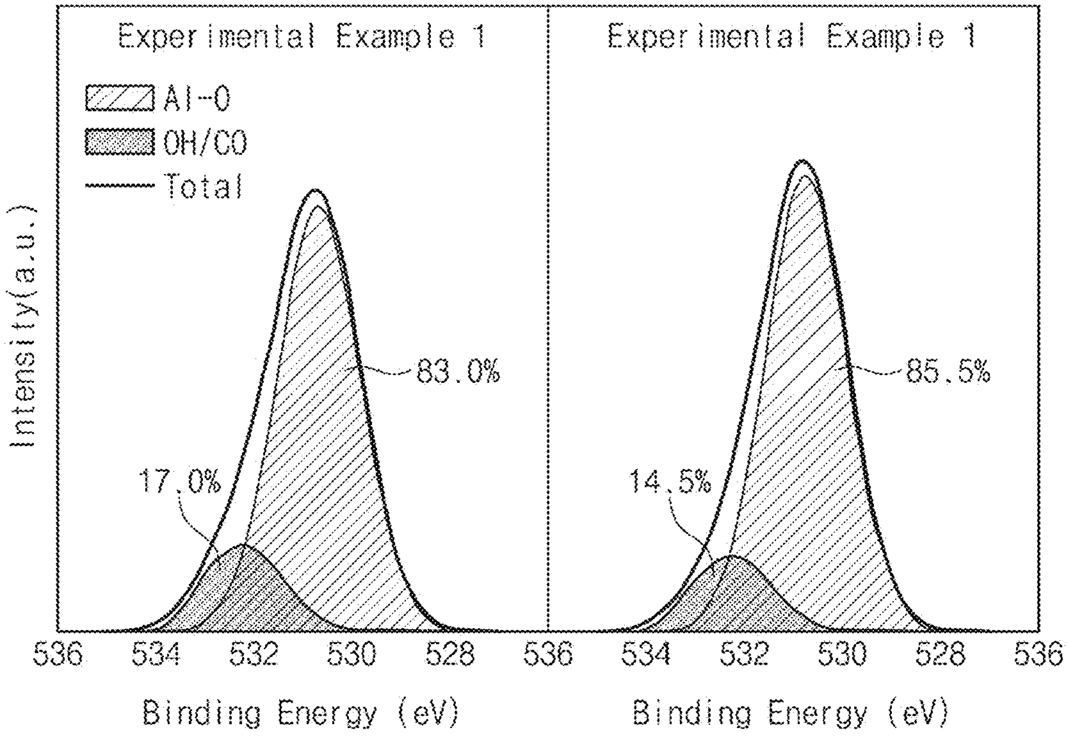
FIG. 13 illustrates graphs showing binding ratios between materials according to components of a dielectric layer.

FIG. 13 illustrates graphs showing binding ratios between materials according to components of a dielectric layer.

Referring to FIG. 13, the $Al_2O_3$ in the experimental example 1 includes more O—H bonds or C—O bonds than the $Al_2O_3$ in the experimental example 6. Thus, the $Al_2O_3$ in the experimental example 1 includes a smaller ratio of Al—O bonds than the $Al_2O_3$ in the experimental example 6. This may mean that the $Al_2O_3$ in the experimental example 1 (i.e., the $Al_2O_3$ formed by the T-ALD process) has a stronger binding force to the impurities (e.g., hydrogen and/or carbon) than the $Al_2O_3$ in the experimental example 6 (i.e., the $Al_2O_3$ formed by the PE-ALD process). Thus, the $Al_2O_3$ formed by the T-ALD process may have high solubility to the impurities.

Figure 14:
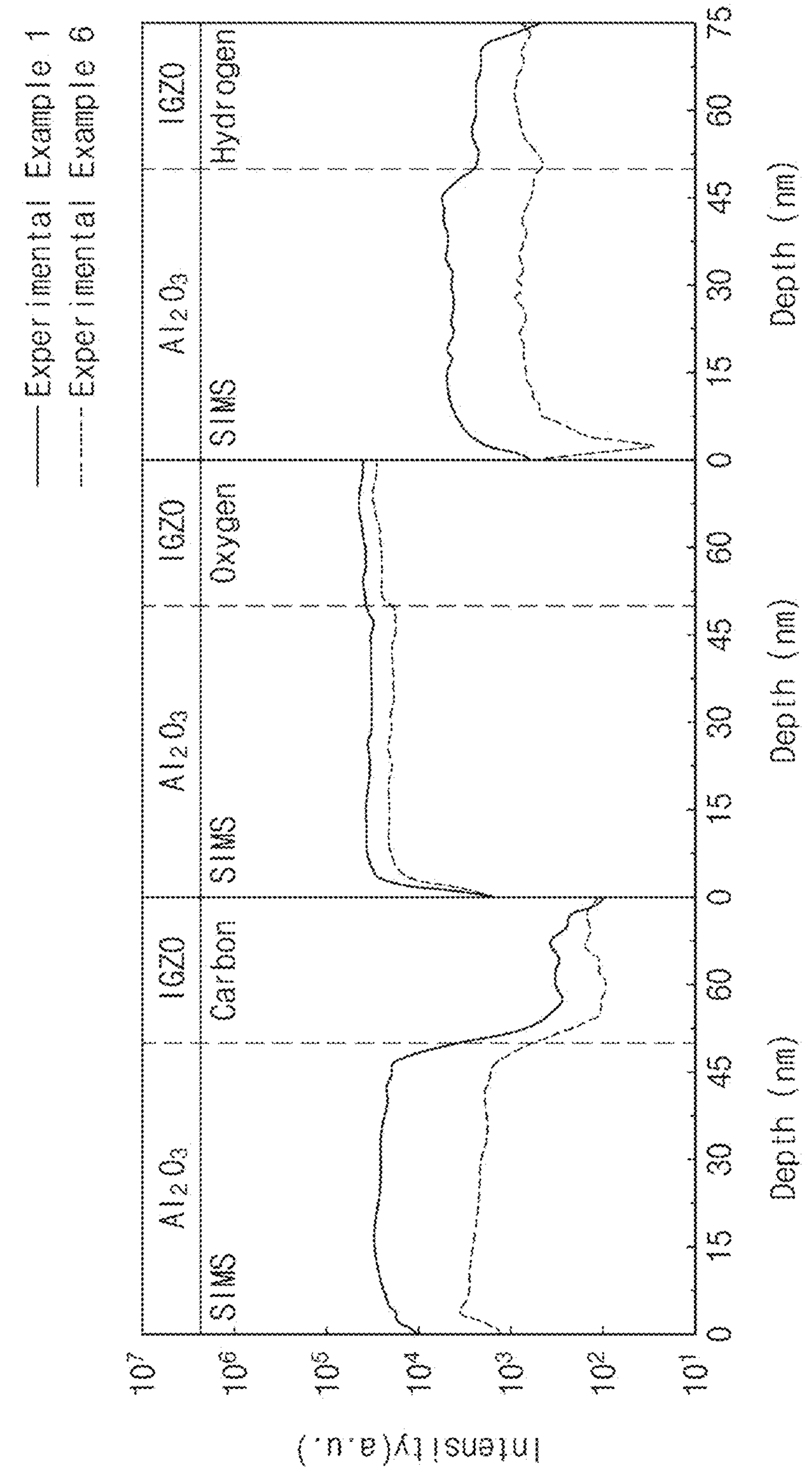
FIG. 14 illustrates graphs showing concentrations of materials in regions of transistors according to components of a dielectric layer.

FIG. 14 illustrates graphs showing concentrations of materials in regions of transistors according to components of a dielectric layer.

Referring to FIG. 14, concentrations of the impurities in regions of the experimental examples 1 and 6 are different from each other. Concentrations of carbon, oxygen and hydrogen of the $Al_2O_3$ formed by the T-ALD process may be higher than those of the $Al_2O_3$ formed by the PE-ALD process, respectively. Since the $Al_2O_3$ formed by the T-ALD process has the stronger binding force to the impurities (e.g., hydrogen and/or carbon) than the $Al_2O_3$ formed by the PE-ALD process as described above with reference to FIG. 13, these concentration profiles may be shown.

Figure 15:
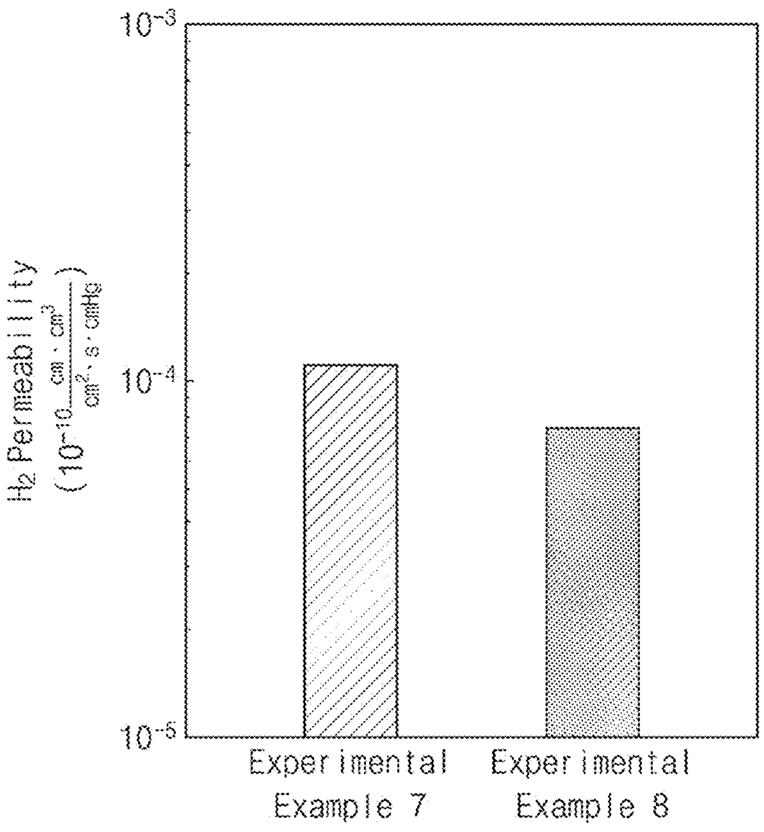
FIG. 15 is a graph showing hydrogen permeability of dielectric layers according to components of the dielectric layers.
Figure 16:
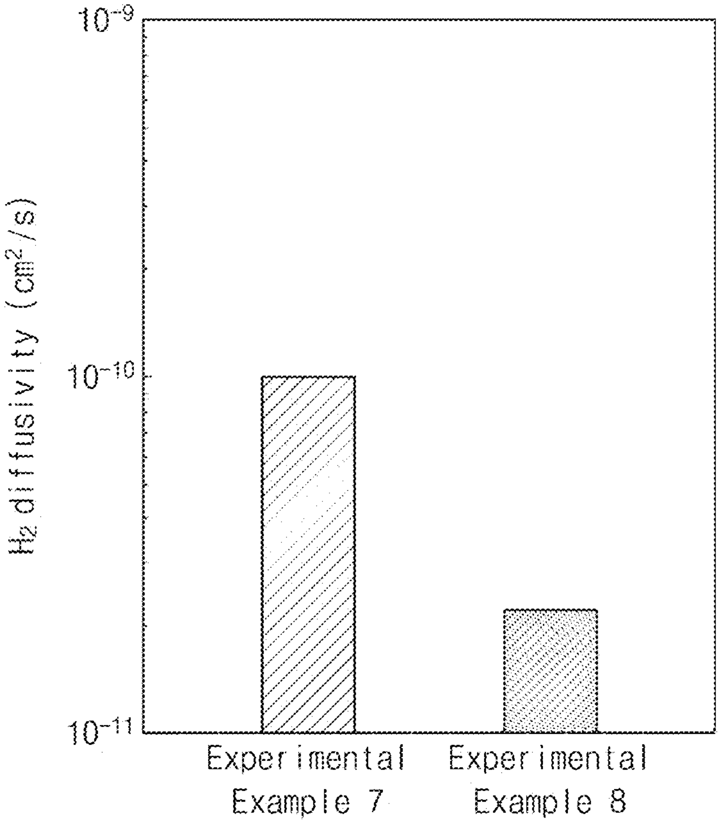
FIG. 16 is a graph showing hydrogen diffusivity according to components of a dielectric layer.
Figure 17:
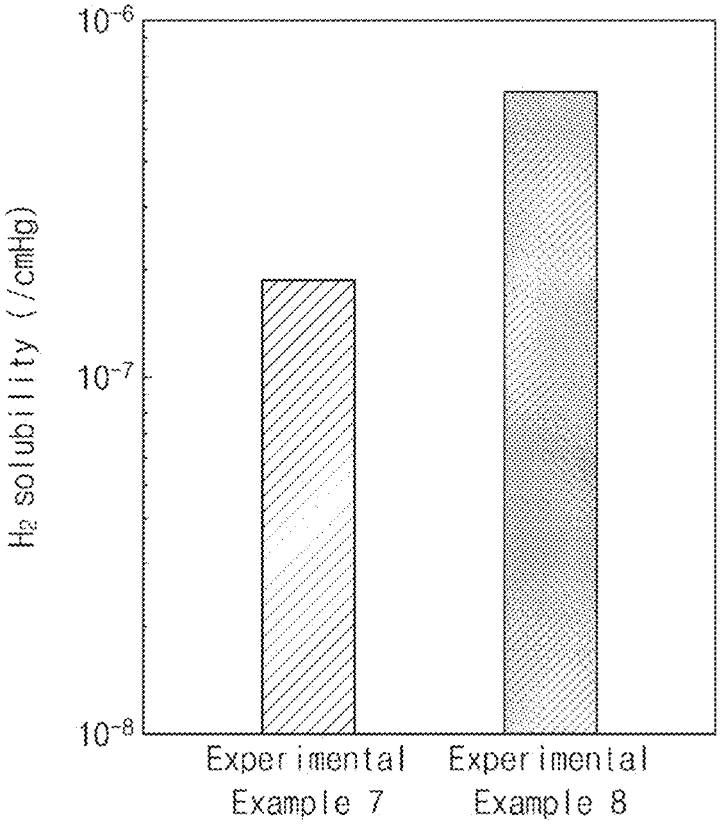
FIG. 17 is a graph showing hydrogen solubility according to components of a dielectric layer.

FIG. 15 is a graph showing hydrogen permeability of dielectric layers according to components of the dielectric layers. FIG. 16 is a graph showing hydrogen diffusivity according to components of a dielectric layer. FIG. 17 is a graph showing hydrogen solubility according to components of a dielectric layer.

Each of experimental examples 7 and 8 was realized by forming $Al_2O_3$ on a polyamide substrate, and a hydrogen permeation experiment was performed. The experimental example 7 included a PE-ALD $Al_2O_3$(i.e., $Al_2O_3$ formed by the PE-ALD process) having a thickness of 15 nm, and the experimental example 8 included a T-ALD $Al_2O_3$(i.e., $Al_2O_3$ formed by the T-ALD process) having a thickness of 15 nm. The hydrogen permeation experiment was performed from a hydrogen gas of 6500 Torr to the hydrogen gas of 2 Torr at 35° C.

Referring to FIG. 15, a hydrogen permeability of the experimental example 7 was higher than that of the experimental example 8. In other words, the PE-ALD $Al_2O_3$ had the hydrogen permeability higher than that of the T-ALD $Al_2O_3$, and thus hydrogen may more easily permeate into the PE-ALD $Al_2O_3$ than into the T-ALD $Al_2O_3$.

Referring to FIG. 16, a hydrogen diffusivity of the experimental example 7 was also higher than that of the experimental example 8. In other words, hydrogen may be more easily diffused into the PE-ALD $Al_2O_3$ than into the T-ALD $Al_2O_3$.

Referring to FIG. 17, a hydrogen solubility of the experimental example 8 was higher than that of the experimental example 7. Here, the hydrogen solubility was calculated by dividing the hydrogen permeability of FIG. 15 by the hydrogen diffusivity of FIG. 16. As a result, it may be recognized that the T-ALD $Al_2O_3$ has a hydrogen solubility higher than that of the PE-ALD $Al_2O_3$.

The dielectric layer may include the first portion and the second portion, which are formed by different processes. The first portion may diffuse the metal material into the semiconductor pattern to improve the electrical characteristics of the semiconductor device, and the second portion may inhibit, prevent or reduce diffusion of the impurities into the semiconductor pattern to improve the electrical characteristics and reliability of the semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device comprising:

a semiconductor pattern;

a dielectric layer on the semiconductor pattern; and a conductive pattern on the dielectric layer, wherein each of the semiconductor pattern and the dielectric layer includes impurities, and wherein the dielectric layer includes a concentration profile of impurities including a first variation section including a first concentration of impurities decreasing throughout the dielectric layer toward the semiconductor pattern, and a second variation section including a second concentration of impurities decreasing throughout the dielectric layer toward the semiconductor pattern, wherein the second variation section is located between the dielectric layer and the semiconductor pattern.

2. The semiconductor device of claim 1, wherein the concentration profile of impurities has a stepped profile decreasing throughout the dielectric layer toward the semiconductor pattern.

3. The semiconductor device of claim 1, wherein the semiconductor pattern includes an oxide semiconductor.

4. The semiconductor device of claim 1, wherein the dielectric layer includes a metal oxide.

5. The semiconductor device of claim 4, wherein the semiconductor pattern includes a metal material of the metal oxide of the dielectric layer.

6. The semiconductor device of claim 1, wherein the impurities include hydrogen or carbon.

7. The semiconductor device of claim 1, wherein the dielectric layer extends from the conductive pattern to the semiconductor pattern without an interface therein.

8. The semiconductor device of claim 1, wherein the dielectric layer includes two or more metal oxides with different hydrogen permeability.

9. A semiconductor device comprising:

a semiconductor pattern;

a dielectric layer including impurities on the semiconductor pattern; and a conductive pattern on the dielectric layer, wherein the dielectric layer includes a first portion adjacent to the semiconductor pattern, and a second portion between the first portion and the conductive pattern, wherein a thickness of the first portion of the dielectric layer in a direction perpendicular to an interface between the dielectric layer and the semiconductor pattern ranges from 20% to 60% of a total thickness of the dielectric layer, and wherein a concentration of impurities decreases throughout the first portion and the second portion of the dielectric layer toward the semiconductor pattern.

10. The semiconductor device of claim 9, wherein the semiconductor pattern includes impurities, and wherein the concentration of impurities decreases throughout the first portion of the dielectric layer toward the semiconductor pattern.

11. The semiconductor device of claim 9, wherein the thickness of the first portion ranges from 15 Å to 40 Å, and wherein a thickness of the second portion ranges from 25 Å to 100 Å.

12. The semiconductor device of claim 9, wherein the first portion of the dielectric layer includes a metal oxide with high hydrogen permeability, and wherein the second portion of the dielectric layer includes a metal oxide with a hydrogen permeability lower than that of the first portion of the dielectric layer.

13. The semiconductor device of claim 9, wherein the impurities include hydrogen or carbon.

14. The semiconductor device of claim 9, wherein the first portion and the second portion are connected to each other without an interface therebetween.

15. A semiconductor device comprising:

a bit line extending in a first direction;

a semiconductor pattern on the bit line, the semiconductor pattern comprising first and second vertical portions spaced apart in the first direction;

a word line on the semiconductor pattern, the word line comprising first and second word lines between the first and second vertical portions and adjacent to the first and second vertical portions, respectively;

a dielectric layer between the semiconductor pattern and the word line; and data storage patterns electrically connected to the first and second vertical portions, respectively, wherein each of the semiconductor pattern and the dielectric layer includes impurities, wherein the dielectric layer includes a concentration profile of impurities, and wherein the concentration profile of impurities includes a first variation section including a first concentration of impurities decreasing throughout the dielectric layer toward the semiconductor pattern, and a second variation section including a second concentration of impurities decreasing throughout the dielectric layer toward the semiconductor pattern, wherein the second variation section is located between the dielectric layer and the semiconductor pattern.

16. The semiconductor device of claim 15, wherein the concentration profile of impurities has a stepped profile decreasing throughout the dielectric layer toward the semiconductor pattern.

17. The semiconductor device of claim 15, wherein the dielectric layer includes a metal oxide.

18. The semiconductor device of claim 15, wherein the impurities include hydrogen or carbon.

19. The semiconductor device of claim 15, wherein the dielectric layer extends from the word line to the semiconductor pattern without an interface therein.

20. The semiconductor device of claim 15, wherein the dielectric layer is between the first vertical portion and the first word line and between the second vertical portion and the second word line.

* * * * *